(12) United States Patent
Ohmi et al.

(10) Patent No.: US 8,889,545 B2
(45) Date of Patent: Nov. 18, 2014

(54) METHOD OF MANUFACTURING A SEMICONDUCTOR DEVICE

(75) Inventors: Tadahiro Ohmi, Miyagi (JP); Xun Gu, Miyagi (JP)

(73) Assignee: National University Corporation Tohoku University, Sendai-shi, Miyagi (JP)

( * ) Notice: Subject to any disclaimer, the term of this patent is extended or adjusted under 35 U.S.C. 154(b) by 0 days.

(21) Appl. No.: 13/877,540

(22) PCT Filed: Oct. 3, 2011

(86) PCT No.: PCT/JP2011/072731
§ 371 (c)(1),
(2), (4) Date: Apr. 3, 2013

(87) PCT Pub. No.: WO2012/046675
PCT Pub. Date: Apr. 12, 2012

(65) Prior Publication Data
US 2013/0187283 A1     Jul. 25, 2013

(30) Foreign Application Priority Data
Oct. 8, 2010   (JP) ................. 2010-228406

(51) Int. Cl.
*H01L 21/4763*    (2006.01)
*H01L 21/768*     (2006.01)
*H01L 23/532*     (2006.01)
*H01L 21/321*     (2006.01)
*H01L 21/02*      (2006.01)
*H01L 21/3105*    (2006.01)
*C23C 16/22*      (2006.01)

(52) U.S. Cl.
CPC .... *H01L 21/76826* (2013.01); *H01L 21/76829* (2013.01); *H01L 23/5329* (2013.01); *H01L 21/3212* (2013.01); *H01L 21/02274* (2013.01); *H01L 21/31058* (2013.01); *H01L 21/76831* (2013.01); *C23C 16/22* (2013.01); *H01L 21/7684* (2013.01); *H01L 21/0212* (2013.01); *H01L 23/53266* (2013.01); *H01L 23/53295* (2013.01); *H01L 23/53238* (2013.01)
USPC .......................................... 438/643; 257/773

(58) Field of Classification Search
USPC .................... 438/643; 257/751, 773
See application file for complete search history.

(56) References Cited

U.S. PATENT DOCUMENTS

2001/0045662 A1* 11/2001 Kajita et al. ............. 257/767
2006/0223306 A1  10/2006 Kawamura et al.
2009/0108413 A1*  4/2009 Ohmi ....................... 257/632

(Continued)

FOREIGN PATENT DOCUMENTS

JP    2005-064302    3/2005
JP    2005-302811    10/2005

(Continued)

OTHER PUBLICATIONS

International Search Report dated Dec. 27, 2011, for International application No. PCT/JP2011/072731.

*Primary Examiner* — Phuc Dang
(74) *Attorney, Agent, or Firm* — Morgan, Lewis & Bockius LLP

(57) ABSTRACT

Provided is a method of manufacturing a semiconductor device of a multilayer wiring structure that comprises a $CF_x$ film as an interlayer insulating film, that can make the most of the advantage of the $CF_x$ film having a low dielectric constant, and that can prevent degradation of the properties of the $CF_x$ film due to CMP. The method of this invention includes (a) forming a $CF_x$ film, (b) forming a recess of a predetermined pattern on the $CF_x$ film, (c) providing a wiring layer so as to bury the recess and to cover the $CF_x$ film, and (d) removing the excess wiring layer on the $CF_x$ film other than in the recess by CMP (Chemical Mechanical Polishing), thereby exposing a surface of the $CF_x$ film, wherein (e) nitriding the surface of the $CF_x$ film is provided before or after (b).

4 Claims, 18 Drawing Sheets

(56) References Cited

U.S. PATENT DOCUMENTS

2009/0108452 A1* 4/2009 Nemoto et al. ............... 257/751
2009/0283901 A1* 11/2009 Ohmi ............................ 257/700
2010/0317188 A1* 12/2010 Nishizawa et al. ........... 438/643

FOREIGN PATENT DOCUMENTS

| JP | 2008-262996 | 10/2008 |
|----|-------------|---------|
| JP | 2009-111251 | 5/2009 |
| WO | 2008/026520 | 3/2008 |

* cited by examiner

METHOD OF MANUFACTURING A SEMICONDUCTOR DEVICE

TECHNICAL FIELD

This invention relates to a method of manufacturing a semiconductor device comprising a wiring structure and to the semiconductor device obtained by such a manufacturing method and, in particular, relates to a method of manufacturing a semiconductor device comprising a multilayer wiring structure comprising a fluorocarbon ($CF_x$) film as an interlayer insulating film and to the semiconductor device obtained by such a manufacturing method.

BACKGROUND ART

In recent years, a semiconductor device uses a multilayer wiring structure for achieving higher integration.

In order to increase the operating speed of the device in such a multilayer wiring structure, it is necessary to reduce parasitic capacitance between wires and delay resistance due to wiring resistance.

Therefore, there is a case where an interlayer insulating film with a low dielectric constant is provided.

As such an interlayer insulating film, there has been proposed a fluorocarbon ($CF_x$) film having an extremely low relative dielectric constant (less than 3.0).

In this case, in a semiconductor device in which multiple circuit layers are formed on a semiconductor substrate formed with a number of semiconductor elements, each circuit layer is manufactured in the following manner.

First, a $CF_x$ film is formed on a lower-side circuit layer by plasma CVD and then a cap film made of, for example, SiCN (silicon carbonitride), SiC, SiN, or the like and a photoresist mask are laminated.

Then, using the photoresist mask, a hole (via hole) or a recess is formed in the cap film and the $CF_x$ film.

Then, after forming a barrier layer so as to cover an exposed surface including an inner surface of the recess, copper or the like as a main component of a wiring layer is embedded in the recess.

Finally, the excess copper and barrier layer (i.e. at a portion other than in the recess) are removed by CMP (Chemical Mechanical Polishing).

Herein, in the CMP, in order to prevent the $CF_x$ film from being directly subjected to a mechanical load, the CMP is stopped while the cap film remains (Patent Document 1).

However, SiCN (relative dielectric constant: about 5), SiC (relative dielectric constant: about 7), SiN (relative dielectric constant: about 8), or the like as the material of the cap film has a higher relative dielectric constant than $CF_x$.

Therefore, if the cap film is provided, as the thickness of the interlayer insulating film decreases, the influence of the presence of the cap film having the high relative dielectric constant increases in the interlayer insulating film including the cap film. That is, the degree of the increase in relative dielectric constant due to the presence of the cap film becomes significant.

Consequently, there is a problem that even if the $CF_x$ film having a relative dielectric constant less than 3.0 is intentionally used as the interlayer insulating film, the advantage of the $CF_x$ film cannot be efficiently utilized due to the cap film.

In view of this, it has also been proposed to provide a wiring layer directly on a $CF_x$ film without providing such a cap film (Patent Document 2).

PRIOR ART DOCUMENT

Patent Document

Patent Document 1: JP-A-2005-302811
Patent Document 2: JP-A-2008-262996

SUMMARY OF THE INVENTION

Problem to be Solved by the Invention

However, the present inventors have found a problem that, in a semiconductor device manufactured by a method of providing a barrier layer and a wiring layer of Cu or the like directly on a $CF_x$ film without providing a cap film as in Patent Document 2 and then removing by CMP the excess wiring layer other than in a recess, the leakage current between wires increases compared to the case where the cap film is provided, and the relative dielectric constant, which is the main concern, also increases.

This invention has been made in view of the above-mentioned problems and it is an object of this invention to provide a method of manufacturing a semiconductor device of a multilayer wiring structure that comprises a $CF_x$ film as an interlayer insulating film, that can make the most of the advantage of the $CF_x$ film having a low dielectric constant, and that can prevent degradation of the properties of the $CF_x$ film due to CMP, and to provide such a semiconductor device.

Means for Solving the Problem

As a result of intensive studies on the above-mentioned problems, the present inventors have found that the composition of the $CF_x$ film is changed due to CMP according to the method of Patent Document 2, and have obtained knowledge that this is the cause of the increase in leakage current and relative dielectric constant.

Based on this knowledge, the present inventors have made further studies. As a result, the present inventors have found that it is possible to prevent degradation (increase in leakage current and relative dielectric constant) of the $CF_x$ film due to CMP by nitriding the $CF_x$ film before forming the wiring layer, and have reached this invention.

Specifically, according to a first aspect of this invention, there is provided a method of manufacturing a semiconductor device, characterized by comprising: a step (a) of forming an interlayer insulating film comprising a $CF_x$ film with no cap film thereon; a step (b) of forming a recess of a predetermined pattern on the $CF_x$ film; a step (c) of providing a wiring layer so as to bury the recess and to cover the $CF_x$ film; and a step (d) of removing the excess wiring layer on the $CF_x$ film other than in the recess by CMP (Chemical Mechanical Polishing), thereby exposing a surface of the $CF_x$ film, wherein a step (e) of nitriding the surface of the $CF_x$ film is provided before or after the step (b).

According to a second aspect of this invention, there is provided a semiconductor device characterized by being manufactured by the method of manufacturing a semiconductor device according to the first aspect.

According to a third aspect of this invention, there is provided a semiconductor device characterized by comprising: a lower-side circuit layer comprising a first $CF_x$ film and a first wiring layer embedded in the first $CF_x$ film; and an upper-side circuit layer formed directly on the lower-side circuit layer and comprising a second $CF_x$ film and a second wiring layer embedded in the second $CF_x$ film, wherein the first $CF_x$ film and the second $CF_x$ film are respectively nitrided at least at their surfaces other than at portions which are respectively in contact with the first wiring layer and the second wiring layer.

According to a fourth aspect of this invention, there is provided a semiconductor device characterized by comprising: an interlayer insulating film comprising a $CF_x$ film and having a recess; and a wiring layer embedded in the recess, wherein the interlayer insulating film is provided with a nitride layer at its surface at least at a portion other than the recess.

In the semiconductor device manufacturing method and the semiconductor device described above, the wiring layer comprises a main wiring layer and a barrier layer which is formed in contact with a back surface of the main wiring layer for preventing diffusion of the main wiring layer into the $CF_x$ film. The conductivity of the main wiring layer is preferably higher than that of the barrier layer. The thickness of the nitrided portion is preferably 1 to 5 nm and more preferably 1 to 2 nm.

Effect of the Invention

According to this invention, in a method of manufacturing a semiconductor device using a $CF_x$ film as an interlayer insulating film, degradation of the $CF_x$ film due to CMP, which is for removing an excess wiring layer, is prevented by nitriding a surface of the $CF_x$ film.

Consequently, it is possible to suppress an increase in the relative dielectric constant of the interlayer insulating film and thus to make the most of the primary advantage of the $CF_x$ film that the relative dielectric constant is lower than that of the wiring layer.

Further, in this invention, since a cap film is not present on the surface of the $CF_x$ film, there occurs no increase in dielectric constant due to the presence of the cap film.

In this invention, since a cap film forming process is not required, etching of the cap film and cleaning following the etching are also not required so that processes can be simplified.

BRIEF DESCRIPTION OF THE DRAWINGS

FIG. 7 is cross-sectional views respectively showing manufacturing processes of the semiconductor device 1a.

FIG. 8 is a flowchart showing the manufacturing processes of the semiconductor device 1a.

MODE FOR CARRYING OUT THE INVENTION

Hereinbelow, preferred embodiments of this invention will be described in detail with reference to the drawings.

First, referring to FIG. 1, the structure of a semiconductor device 1 according to a first embodiment will be described.

Figure 1:
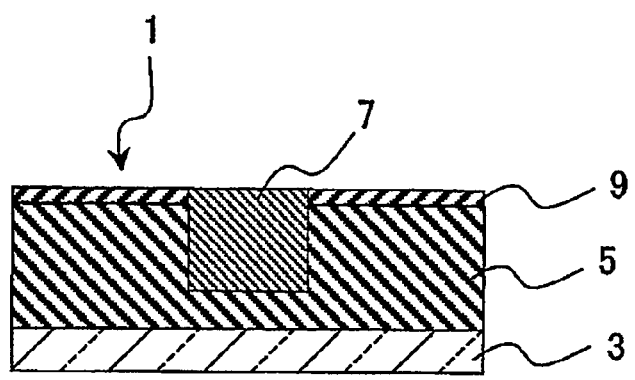
FIG. 1 is a cross-sectional view showing the structure of a semiconductor device 1 according to a first embodiment.
Figure 2:
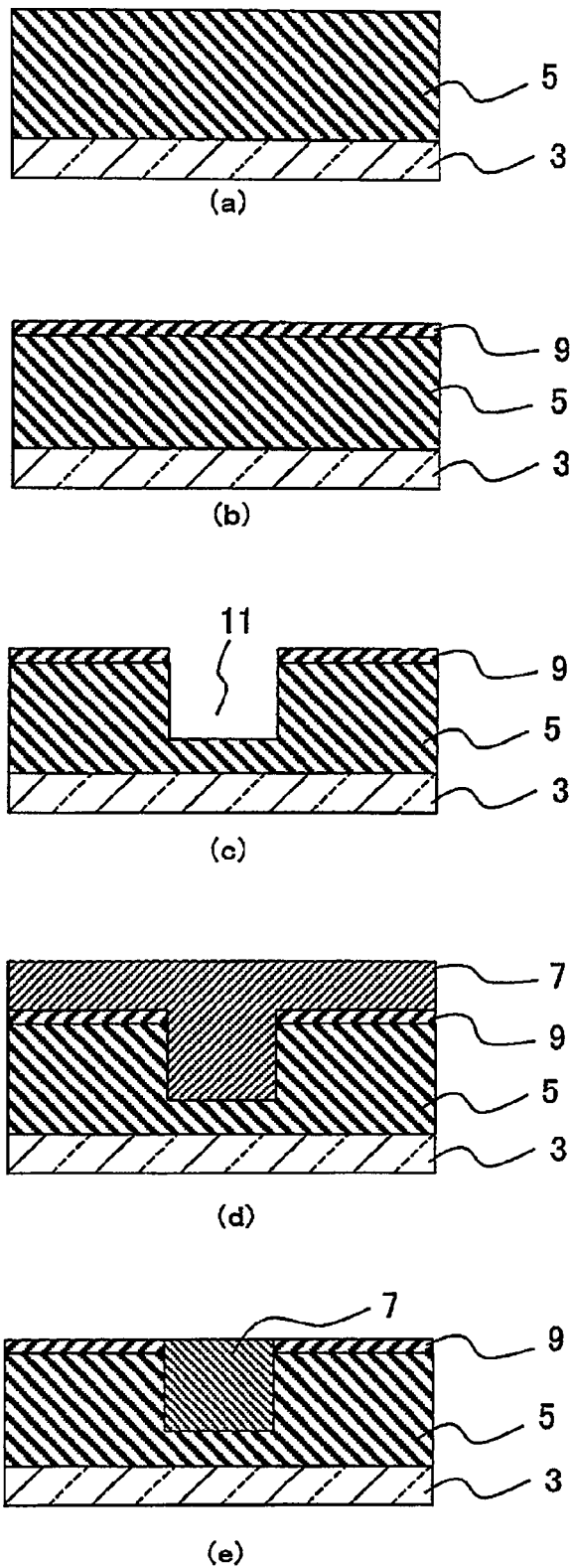
FIG. 2 is cross-sectional views respectively showing manufacturing processes of the semiconductor device 1.

As shown in FIG. 1, the semiconductor device 1 comprises an interlayer insulating film formed on a substrate 3 and a wiring layer 7 embedded in the interlayer insulating film.

The interlayer insulating film is a $CF_x$ film 5 and a nitride layer 9 is formed at a surface thereof.

As is clear from FIG. 1, the semiconductor device 1 has no cap film of SiCN (silicon carbonitride), SiC, SiN, or the like on the interlayer insulating film.

Next, referring to FIGS. 2 to 5, the sequence of manufacturing the semiconductor device 1 will be described.

First, a substrate 3 is prepared. As the substrate 3, there can be cited a semiconductor substrate formed with a number of semiconductor elements and having a surface coated with $SiO_2$, SiCN, or the like.

Figure 3:
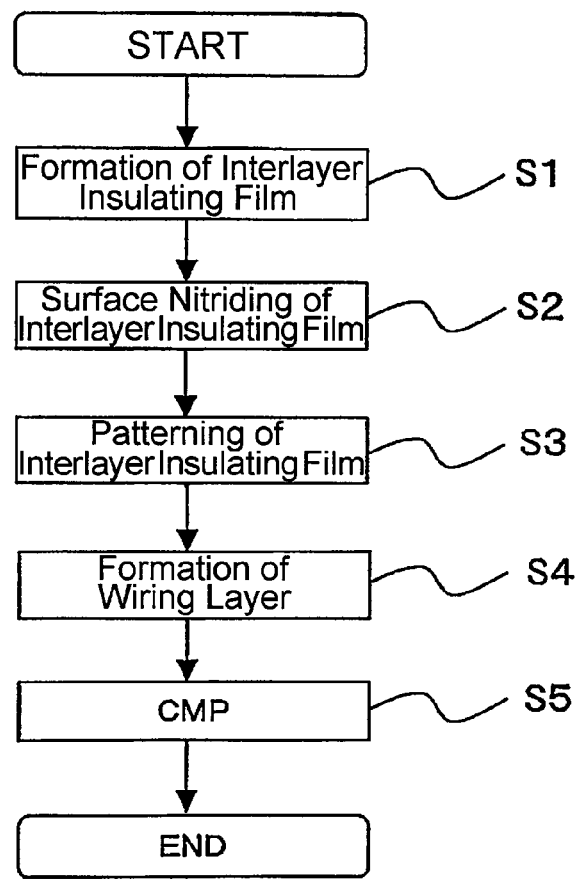
FIG. 3 is a flowchart showing the manufacturing processes of the semiconductor device 1.

Then, as shown in FIG. 2(a), a $CF_x$ film 5 is formed on the substrate 3 (S1 in FIG. 3).

Specifically, the $CF_x$ film 5 is formed by plasma CVD using a plasma processing apparatus 102.

Herein, the schematic structure and the operation of the plasma processing apparatus 102 will be described with reference to FIG. 4.

First, the schematic structure of the plasma processing apparatus 102 will be described.

Figure 4:
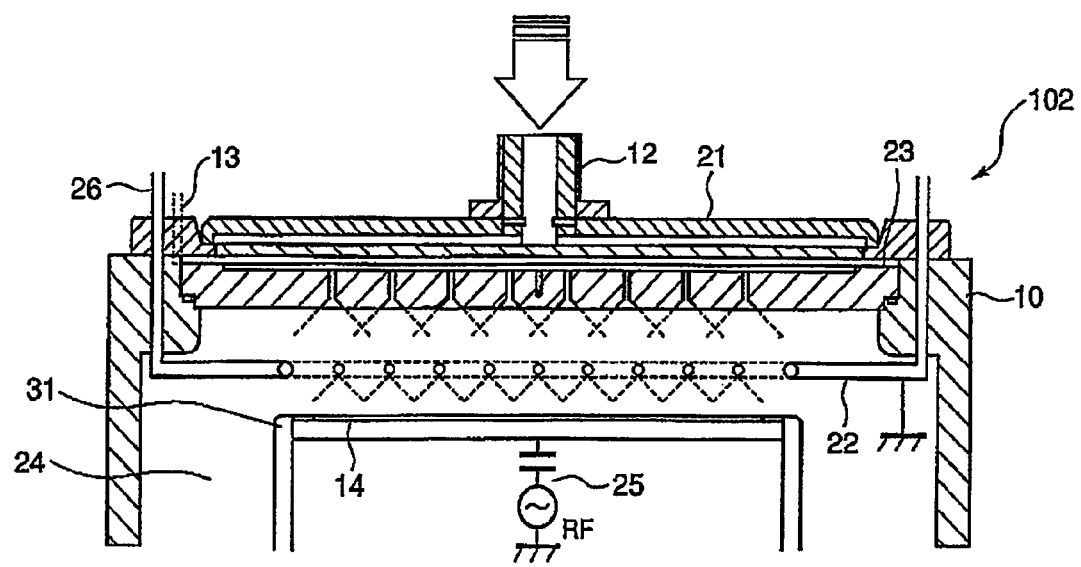
FIG. 4 is a cross-sectional view showing a plasma processing apparatus 102 for use in the manufacture of the semiconductor device 1.

The plasma processing apparatus 102 is a microwave-excited plasma processing apparatus and, as shown in FIG. 4, comprises a process chamber 24 surrounded by an outer wall 10, a radial line slot antenna (RLSA) 21 provided above the process chamber 24, comprising an antenna 12, and adapted to generate a microwave, an insulator plate provided under the radial line slot antenna (RLSA) 21, an upper shower plate 23 provided under the insulator plate, and a gas introducing pipe 13 provided adjacent to the upper shower plate 23.

The plasma processing apparatus 102 further comprises a lower shower plate 22 disposed in a diffusion plasma region of the process chamber 24 and a gas introducing pipe 26 connected to the lower shower plate 22.

A stage 31 on which a wafer 14 as a workpiece substrate is placed is provided in the process chamber 24 at a place where a plasma is diffused and directly irradiated. An RF power supply 25 is connected to the stage 31.

The process chamber 24 is provided with an exhaust port, an exhaust duct, and a small pump, which are not illustrated, for discharging an exhaust gas which is generated during the processing.

Next, the operation of the plasma processing apparatus 102 in S1 will be described.

First, the substrate 3 is placed on the stage 31. Then, using the radial line slot antenna (RLSA) 21, a microwave is uniformly introduced into the process chamber 24. Specifically, the microwave is transmitted through the insulator plate and the upper shower plate 23 and radiated into a plasma generating region.

Then, a noble gas such as a Xe gas or an Ar gas is uniformly ejected into the plasma generating region from the upper shower plate 23 through the gas introducing pipe 13 so that a plasma is excited by the microwave radiated into the plasma generating region.

Then, a fluorocarbon gas is caused to flow from the lower shower plate 22 so that the $CF_x$ film 5 is formed on the substrate 3 by decomposition of the fluorocarbon gas due to the plasma of the noble gas.

As the fluorocarbon gas, use can be made of an unsaturated aliphatic fluoride expressed by a general formula $C_nF_{2n}$ (where n is an integer of 2 to 8) or $C_nF_{2n-2}$ (n is an integer of 2 to 8), but is preferably made of a fluorocarbon expressed by a general formula $C_5F_8$, such as a fluorocarbon containing octafluoropentyne, octafluoropentadiene, octafluorocyclopentene, octafluoromethylbutadiene, octafluoromethylbutyne, fluorocyclopropene, or fluorocyclopropane, or a fluorocarbon containing fluorocyclobutene or fluorocyclobutane.

The foregoing is the description of S1.

Then, as shown in FIG. 2(b), a nitride layer 9 is formed by nitriding a surface of the $CF_x$ film 5 (S2 in FIG. 3).

Specifically, using the plasma processing apparatus 102 of FIG. 4 described above, a microwave is generated in the same manner as in S1 and further a nitriding gas such as an $N_2/H_2$ or $NH_3$ gas is caused to flow from the upper shower plate 23, thereby exciting an $Ar/N_2$ plasma or an $N_2$ plasma to nitride the surface of the $CF_x$ film 5.

In this event, the thickness of the nitride layer 9 is preferably set to 1 to 5 nm and more preferably 1 to 2 nm.

Although details will be described later, it is possible to prevent degradation of the $CF_x$ film 5 due to CMP by nitriding the surface of the $CF_x$ film 5 in the manner described above.

Then, as shown in FIG. 2(c), the $CF_x$ film 5 is patterned by etching or the like, thereby forming a recess 11 on the surface thereof (S3 in FIG. 3).

Then, as shown in FIG. 2(d), a wiring layer 7 comprising a metal such as Cu or Ti is formed so as to bury the recess 11 and to cover the $CF_x$ film 5 (S4 in FIG. 3).

Then, as shown in FIG. 2(e), the excess wiring layer 7 on the $CF_x$ film 5 other than in the recess 11 is removed by CMP (Chemical Mechanical Polishing), thereby exposing the nitride layer 9 of the $CF_x$ film 5 (S5 in FIG. 3).

Specifically, the wiring layer 7 is polished using a CMP apparatus 201, thereby exposing the nitride layer 9 of the $CF_x$ film 5.

Herein, the schematic structure and operation of the CMP apparatus 201 will be described with reference to FIG. 5.

First, the schematic structure of the CMP apparatus 201 will be described.

Figure 5:
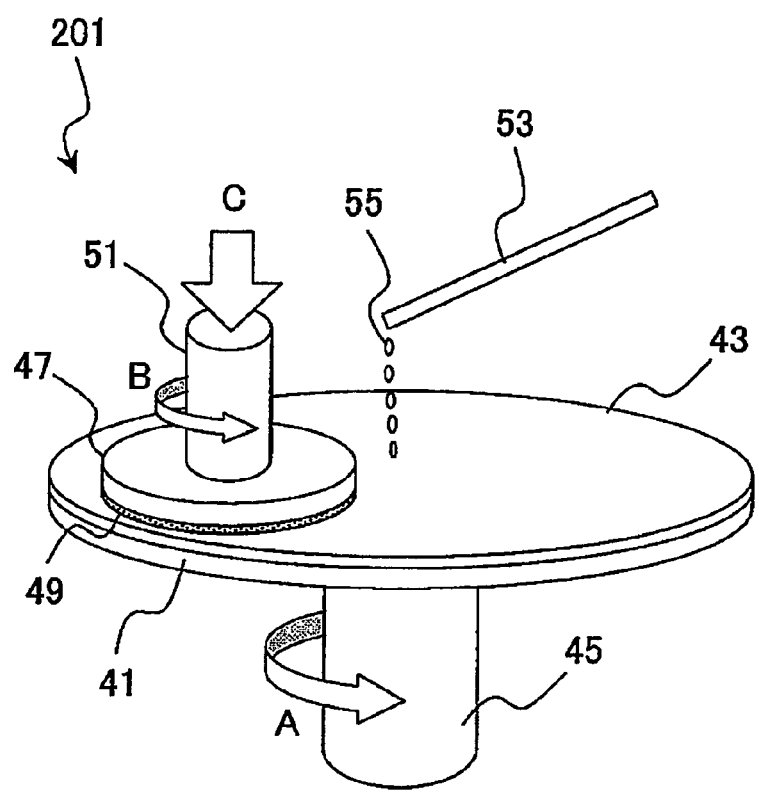
FIG. 5 is a perspective view showing a CMP (Chemical Mechanical Polishing) apparatus 201 for use in the manufacture of the semiconductor device 1.

As shown in FIG. 5, the CMP apparatus 201 comprises a rotatable disc-shaped plate 41 and a polishing pad 43 made of a resin such as urethane is provided on an upper surface of the plate 41.

Further, a shaft 45 for rotating the plate 41 is provided on a lower surface of the plate 41. The shaft 45 is connected to a non-illustrated drive mechanism such as a motor.

On the other hand, in the CMP apparatus 201, a disc-shaped carrier 47 holding a workpiece 49 to be polished is provided so as to face the pad 43.

A lower surface of the carrier 47 has a structure capable of holding the to-be-polished workpiece 49 while a shaft 51 for rotating the carrier 47 is provided on an upper surface of the carrier 47. The shaft 51 is connected to a non-illustrated drive mechanism such as a motor.

Further, the CMP apparatus 201 comprises, above the pad 43, a supply pipe 53 for supplying a polishing slurry 55.

Next, the schematic operation of the CMP apparatus 201 in S5 will be described. First, the sample obtained as the to-be-polished workpiece 49 in S4 is held on the lower surface of the carrier 47 so that the wiring layer 7 faces the pad 43.

Then, the plate 41 is rotated in a direction A in FIG. 5 while supplying the slurry 55 on the pad 43 from the supply pipe 53 and simultaneously the carrier 47 is rotated in a direction B in FIG. 5 while applying a polishing pressure (a force applied in a direction C in FIG. 5) to the carrier 47, thereby carrying out polishing until the nitride layer 9 of the $CF_x$ film 5 is exposed.

The foregoing is the details of S5.

In this manner, the semiconductor device 1 shown in FIG. 1 is completed.

As described above, according to the first embodiment, the semiconductor device 1 is manufactured by forming the $CF_x$ film as the interlayer insulating film, then nitriding the surface of the $CF_x$ film 5, and then carrying out the formation and CMP of the wiring layer 7.

Consequently, it is possible to prevent degradation of the $CF_x$ film 5 due to the CMP.

Further, since there is no need to provide a cap layer in the first embodiment, there occurs no increase in dielectric constant due to the cap layer. Further, since there is no need to provide the cap layer, a process of providing the cap layer is not required so that the manufacturing processes of the semiconductor device 1 can be simplified.

Next, a second embodiment will be described with reference to FIGS. 6 to 8.

The second embodiment is such that, in the first embodiment, the surface of the $CF_x$ film 5 is nitrided after forming the recess 11.

In the second embodiment, the same numerals are assigned to components having the same functions as in the first embodiment, thereby mainly describing those portions which are different from the first embodiment.

First, referring to FIG. 6, the structure of a semiconductor device 1a according to the second embodiment will be described.

Figure 6:
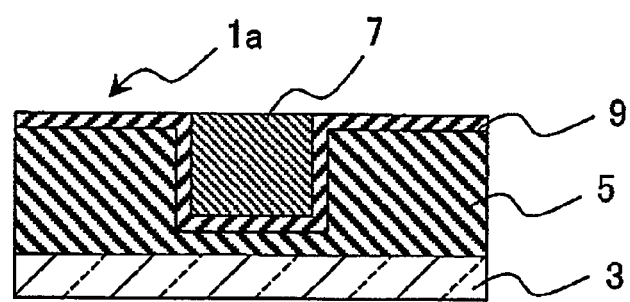
FIG. 6 is a cross-sectional view showing the structure of a semiconductor device 1a according to a second embodiment.
Figure 7:
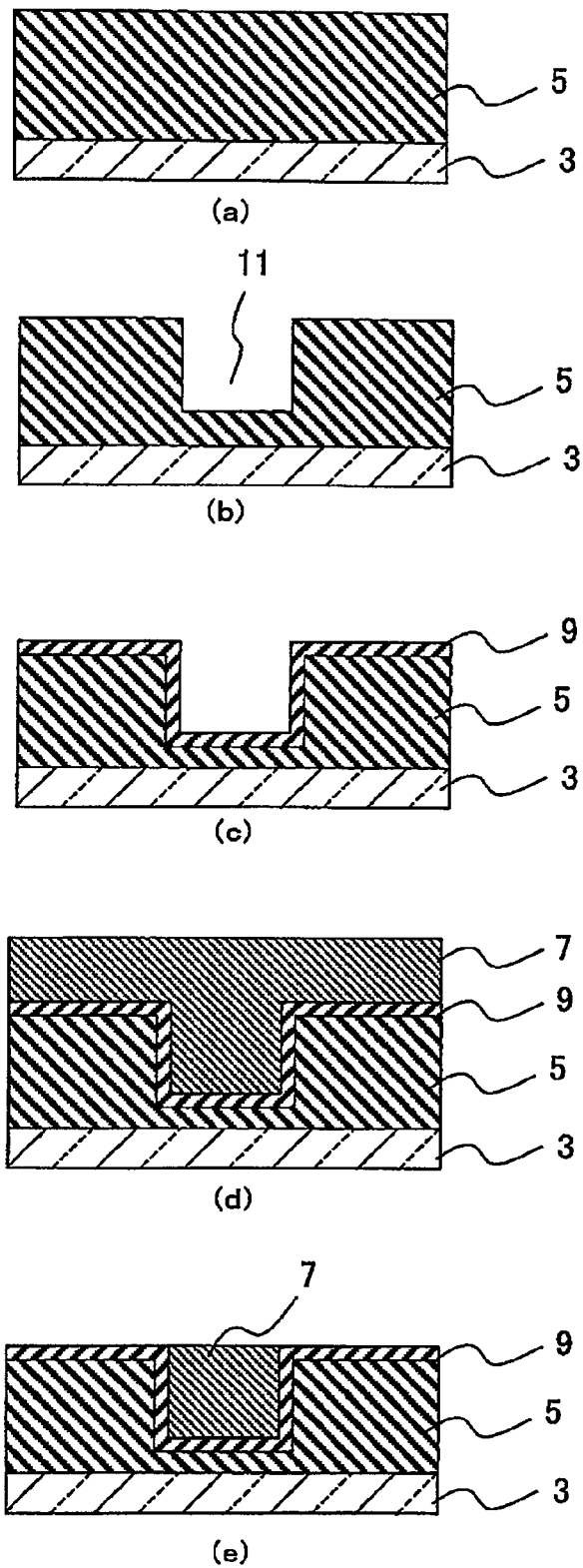

As shown in FIG. 6, the semiconductor device 1a comprises a $CF_x$ film 5 formed on a substrate 3 and a wiring layer 7 embedded in the $CF_x$ film 5.

A nitride layer 9 is formed at a surface of the $CF_x$ film 5.

As is clear from FIG. 6, in the semiconductor device 1a, the nitride layer 9 is formed also at an inner wall and a bottom surface of a recess 11 of the $CF_x$ film 5, i.e. at the portions in contact with the wiring layer 7.

Next, referring to FIGS. 6 to 8, the sequence of manufacturing the semiconductor device 1a will be described.

First, a substrate 3 is prepared.

Figure 8:
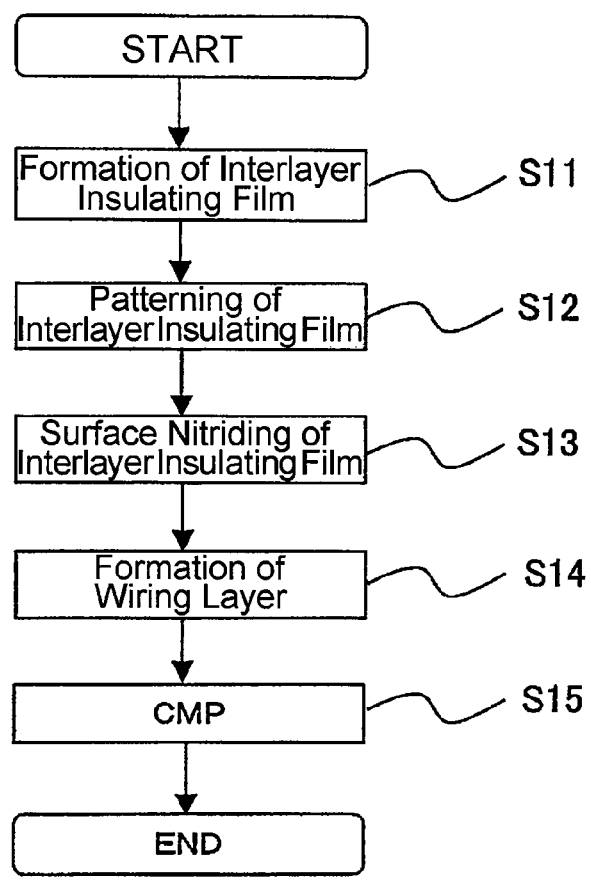

Then, as shown in FIG. 7(a), a $CF_x$ film 5 is formed on the substrate 3 (S11 in FIG. 8).

Specifically, the $CF_x$ film 5 is formed by plasma CVD using the plasma processing apparatus 102.

Since the specific apparatus structure and a specific method of forming the $CF_x$ film 5 are the same as those in the first embodiment, description thereof is omitted.

Then, as shown in FIG. 7(b), the $CF_x$ film 5 is patterned by etching or the like, thereby forming a recess 11 on a surface thereof (S12 in FIG. 8).

Then, as shown in FIG. 7(c), a nitride layer 9 is formed by nitriding the surface of the $CF_x$ film 5 (S13 in FIG. 8).

Since a specific nitriding method and the thickness of the nitride layer 9 are the same as those in the first embodiment, description thereof is omitted.

Then, as shown in FIG. 7(d), a wiring layer 7 comprising a metal such as Cu is formed so as to bury the recess 11 and to cover the $CF_x$ film 5 (S14 in FIG. 8).

Then, as shown in FIG. 7(e), the excess wiring layer 7 on the $CF_x$ film 5 other than in the recess 11 is removed by CMP (Chemical Mechanical Polishing), thereby exposing the surface (of the nitride layer 9) of the $CF_x$ film 5 (S15 in FIG. 8).

Since a specific CMP apparatus and method are the same as those in the first embodiment, description thereof is omitted.

In this manner, the semiconductor device 1a shown in FIG. 6 is completed.

As described above, according to the second embodiment, the semiconductor device 1a is manufactured by forming the $CF_x$ film 5 as an interlayer insulating film, then nitriding the surface of the $CF_x$ film 5, and then carrying out the formation and CMP of the wiring layer 7.

Therefore, the second embodiment achieves the same effect as the first embodiment.

Further, according to the second embodiment, the semiconductor device 1a is such that the surface of the $CF_x$ film 5 is nitrided after forming the recess 11.

Consequently, even if the inner surface of the recess 11 of the $CF_x$ film 5 is damaged by the etching, it is possible to reduce the influence due to such damage.

Next, a third embodiment will be described with reference to FIGS. 9 to 11.

The third embodiment is such that, in the first embodiment, the wiring layer 7 has a two-layer structure of a main wiring layer 8a and a barrier layer 8b.

In the third embodiment, the same numerals are assigned to components having the same functions as in the first embodiment, thereby omitting description thereof.

Figure 9:
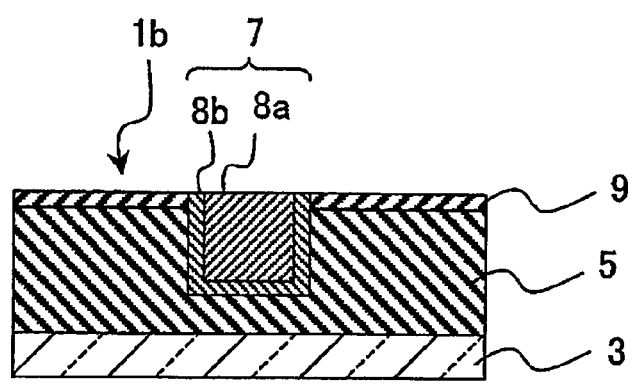
FIG. 9 is a cross-sectional view showing the structure of a semiconductor device 1b according to a third embodiment.

As shown in FIG. 9, in a semiconductor device 1b according to the third embodiment, a wiring layer 7 has a two-layer structure of a main wiring layer 8a and a barrier layer 8b.

Specifically, the wiring layer 7 comprises the main wiring layer 8a containing a metal such as Cu or Ti and the barrier layer 8b which is provided on a $CF_x$ film 5 so as to be in contact with the main wiring layer 8a and serves to prevent the material forming the main wiring layer 8a from diffusing into the $CF_x$ film 5.

A metal nitride such TiN, for example, is used as the barrier layer 8b.

Next, referring to FIGS. 9 to 11, the sequence of manufacturing the semiconductor device 1b will be described.

First, a substrate 3 is prepared.

Figure 10:
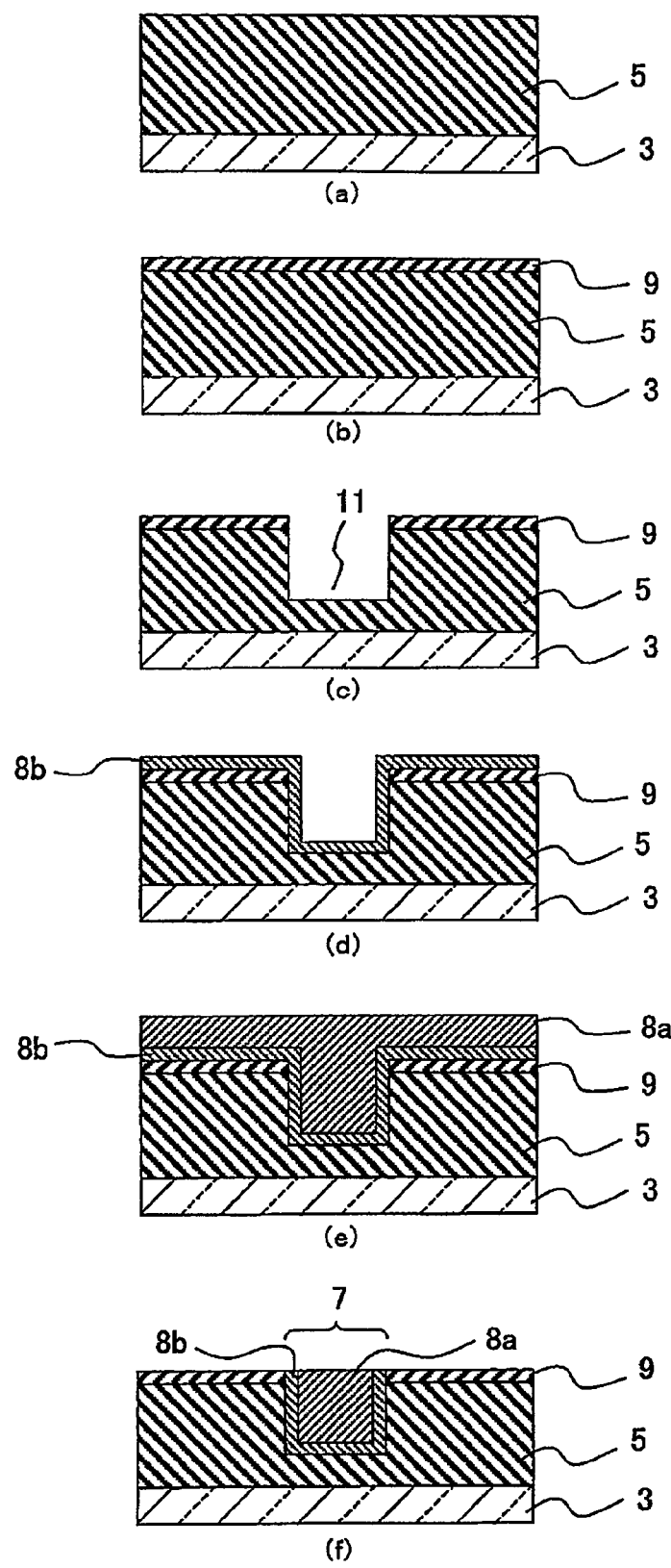
FIG. 10 is cross-sectional views respectively showing manufacturing processes of the semiconductor device 1b.
Figure 11:
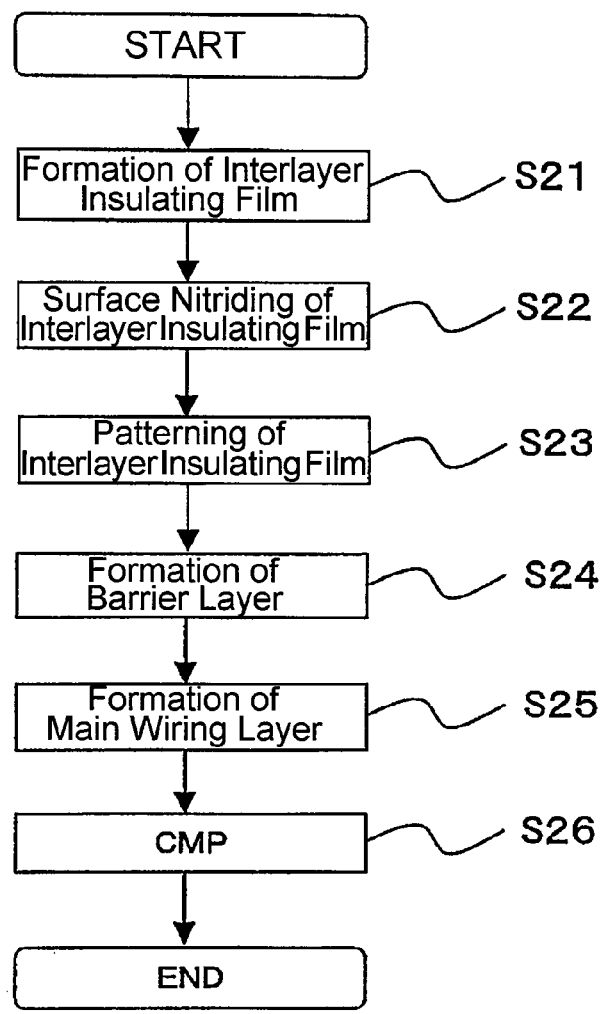
FIG. 11 is a flowchart showing the manufacturing processes of the semiconductor device 1b.

Then, as shown in FIG. 10(a), a $CF_x$ film 5 is formed on the substrate 3 (S21 in FIG. 11).

Specifically, the $CF_x$ film 5 is formed by plasma CVD using the plasma processing apparatus 102. Since a specific method of forming the $CF_x$ film 5 is the same as that in the first embodiment, description thereof is omitted.

Then, as shown in FIG. 10(b), a nitride layer 9 is formed by nitriding a surface of the $CF_x$ film 5 (S22 in FIG. 11).

A specific nitriding method and the thickness of the nitride layer 9 are the same as those in the first embodiment.

Then, as shown in FIG. 10(c), the $CF_x$ film 5 is patterned by etching or the like, thereby forming a recess 11 on the surface thereof (S23 in FIG. 11).

Then, as shown in FIG. 10(d), a barrier layer 8b is formed on the surface of the $CF_x$ film 5 (S24 in FIG. 11).

Then, as shown in FIG. 10(e), a main wiring layer 8a is formed so as to bury the recess 11 and to cover the $CF_x$ film 5 (S25 in FIG. 11). As the main wiring layer 8a, use is made of the above-mentioned material such as Cu or Ti having a higher conductivity than the barrier layer 8b.

Then, as shown in FIG. 10(f), the excess wiring layer 7 on the $CF_x$ film 5 other than in the recess 11 is removed by CMP (Chemical Mechanical Polishing), thereby exposing the surface (of the nitride layer 9) of the $CF_x$ film 5 (S26 in FIG. 11).

Since a specific CMP apparatus and method are the same as those in the first embodiment, description thereof is omitted.

In this manner, the semiconductor device 1b shown in FIG. 9 is completed.

As described above, according to the third embodiment, the semiconductor device 1b is manufactured by forming the $CF_x$ film 5 as an interlayer insulating film, then nitriding the surface of the $CF_x$ film 5, and then carrying out the formation and CMP of the wiring layer 7.

Therefore, the third embodiment achieves the same effect as the first embodiment.

Further, according to the third embodiment, the semiconductor device 1b is such that the wiring layer 7 has the two-layer structure of the main wiring layer 8a and the barrier layer 8b.

Consequently, it is possible to prevent the material forming the main wiring layer 8a from diffusing into the $CF_x$ film 5.

Next, a fourth embodiment will be described with reference to FIG. 12.

The fourth embodiment is such that, in the third embodiment, a semiconductor device 1c comprises a multilayer wiring structure in which wiring layers and interlayer insulating films ($CF_x$ films) are laminated.

In the fourth embodiment, the same numerals are assigned to components having the same functions as in the third embodiment, thereby omitting description thereof.

Figure 12:
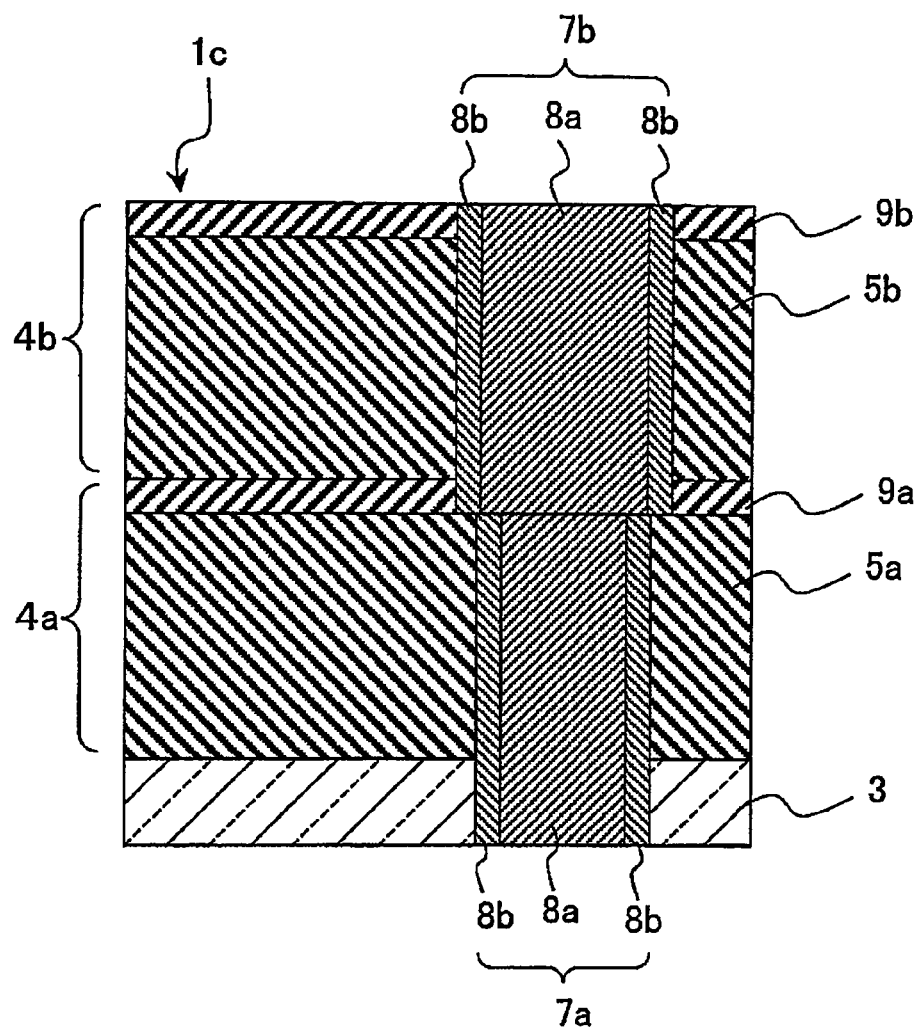
FIG. 12 is a cross-sectional view showing the structure of a semiconductor device 1c according to a fourth embodiment.

As shown in FIG. 12, the semiconductor device 1c according to the fourth embodiment comprises a first $CF_x$ film 5a formed on a substrate 3 and a first wiring layer 7a embedded in the first $CF_x$ film 5a.

The first wiring layer 7a comprises a barrier layer 8b provided in contact with the first $CF_x$ film 5a and a main wiring layer 8a provided in contact with the barrier layer.

The first $CF_x$ film 5a is provided at its surface with a first nitride layer 9a. A second $CF_x$ film 5b is formed on the first nitride layer 9a and a second wiring layer 7b is embedded in the second $CF_x$ film 5b.

The second wiring layer 7b comprises a barrier layer 8b provided in contact with the second $CF_x$ film 5b and a main wiring layer 8a provided in contact with the barrier layer 8b.

The second $CF_x$ film 5b is provided at its surface with a second nitride layer 9b.

Herein, the first $CF_x$ film 5a and the second $CF_x$ film 5b are the films having the same composition and structure as the $CF_x$ film 5 in the third embodiment.

Further, the first wiring layer 7a and the second wiring layer 7b are the films having the same composition and structure as the wiring layer 7 in the third embodiment.

Further, the first nitride layer 9a and the second nitride layer 9b are the films having the same composition and structure as the nitride layer 9 in the third embodiment.

That is, the semiconductor device 1c comprises a lower-side circuit layer 4a comprising the first $CF_x$ film 5a, the first wiring layer 7a, and the first nitride layer 9a and an upper-side circuit layer 4b comprising the second $CF_x$ film 5b, the second wiring layer 7b, and the second nitride layer 9b.

In this manner, the semiconductor device 1c may comprise the multilayer wiring structure in which the wiring layers and the interlayer insulating films are laminated.

A manufacturing method of the semiconductor device 1c is the same as the manufacturing method of the semiconductor device 1b.

That is, the first $CF_x$ film 5a, the first nitride layer 9a, and the first wiring layer 7a are formed on the substrate 3 according to the sequence of S21 to S26 in FIG. 11 and, further thereon, the second $CF_x$ film 5b, the second nitride layer 9b, and the second wiring layer 7b are formed according to the sequence of S21 to S26 in FIG. 11.

As described above, according to the fourth embodiment, the semiconductor device 1c is manufactured by forming each of the first $CF_x$ film 5a and the second $CF_x$ film 5b, then nitriding the surface of each of the first $CF_x$ film 5a and the second $CF_x$ film 5b, and then carrying out the formation and CMP of each of the first wiring layer 7a and the second wiring layer 7b.

Therefore, the fourth embodiment achieves the same effect as the third embodiment.

EXAMPLES

Hereinbelow, this invention will be described in further detail based on Examples.

Semiconductor devices 1b, each as shown in FIG. 9, were manufactured according to the sequence shown in FIGS. 10 and 11 under the following conditions and the leakage current, the dielectric constant, and the structure of a $CF_x$ film 5 were evaluated. Specific sequences were as follows.

Manufacture of Samples

Example 1

First, a silicon substrate was prepared as a substrate 3 and a $CF_x$ film 5 was formed using the plasma processing apparatus 102 shown in FIG. 4. The processing conditions in this event were as follows.
Process Chamber Pressure: 28 mTorr (3.73 Pa)
Type of Gas (Flow Rate): Ar (70 sccm) and $C_5F_8$ (200 sccm)
Microwave Output: 1450 W
Film Forming Time: 200 seconds
Film Forming Temperature: 365° C.
Film Thickness: 150 nm Then, using the plasma processing apparatus 102 shown in FIG. 4, a nitride layer 9 was formed at a surface of the $CF_x$ film 5. The processing conditions in this event were as follows.
Process Chamber Pressure: 100 mtorr (13.3 Pa)
Type of Gas (Flow Rate): $N_2$ (80 sccm) and Ar (20 sccm)
Microwave Output: 2 kW
Bias Voltage: 150V
Processing Temperature: 25° C.
Processing Time: 30 seconds
Nitride Layer Thickness: 1 to 2 nm Then, using a sputtering apparatus, patterns 59, 61a, and 61b shown in FIG. 13 were formed as a recess 11 on the $CF_x$ film 5.

Figure 13:
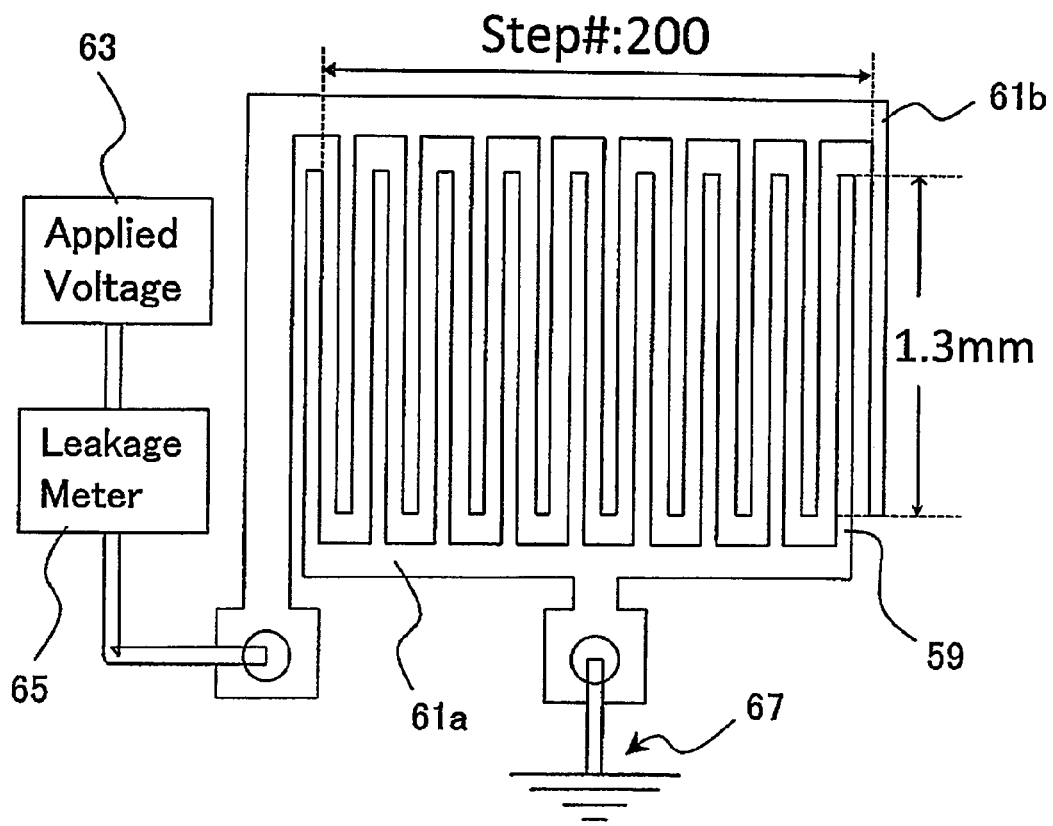
FIG. 13 is a plan view showing the plan-view pattern shape of a wiring layer 7 (recess 11) and the configuration of components which are connected to the wiring layer 7 at the time of leakage current detection.

To explain more specifically with reference to FIG. 13, the plan-view shape of the recess 11 has a shape of a pair of combs which are arranged so as to mesh with each other, wherein elongated plate-like patterns 61a and 61b provided so as to face each other correspond to the bases of the combs, respectively, and elongated plate-like patterns 59 extending perpendicularly from a long side of each of the patterns 61a and 61b at a predetermined interval correspond to the teeth of each comb.

The patterns 59 are provided at a predetermined interval so that long-side portions thereof face each other, wherein the patterns 59 connected to the pattern 61a and the patterns 59 connected to the pattern 61b are not in contact with each other and are arranged at an interval of 1.0 to 1.2 μm.

In the long-side portion of each pattern 59, the length of a portion facing the adjacent other pattern 59 is 1.3 mm. The number of the patterns 59 formed on each of the patterns 61a and 61b is 200 and the aspect ratio is 1.

Then, Ti was formed to 20 nm thick as a barrier layer 8b of a wiring layer 7 and then Cu was formed by plating as a main wiring layer 8a of the wiring layer 7.

Finally, the wiring layer 7 was polished using an apparatus (APD-800 manufactured by Araca Incorporated) having the same structure as the CMP apparatus 201 shown in FIG. 5. The polishing conditions in this event were as follows.
Pad: Politex (registered trademark) manufactured by Rohm and Haas Electronic Materials
Slurry: HS-815-B1 manufactured by Hitachi Chemical Co., Ltd.
Polishing Agent Ratio: slurry/$H_2O_2$=19.6/0.04
Polishing Agent Flow Rate: 300 mL/min
Polishing Pressure: 1.5 PSI (10340 Pa)
Rotational Speed: pad/wafer=50 rpm/50 rpm
Overpolish Time: 15 seconds A sample was manufactured by the processes described above.

Example 2

A sample was manufactured under the same conditions as in Example 1 except that the overpolish time was set to 20 seconds.

Example 3

A sample was manufactured under the same conditions as in Example 1 except that the overpolish time was set to 30 seconds.

Comparative Example 1

A sample was manufactured under the same conditions as in Example 1 except that the overpolish time was set to 0 seconds. That is, the sample was only immersed in the slurry and no polishing was carried out.

Comparative Example 2

A sample was manufactured under the same conditions as in Example 1 except that no nitriding was carried out.

Comparative Example 3

A sample was manufactured under the same conditions as in Example 1 except that no nitriding was carried out and that the overpolish time was set to 20 seconds.

Comparative Example 4

A sample was manufactured under the same conditions as in Example 1 except that no nitriding was carried out and that the overpolish time was set to 30 seconds.

Comparative Example 5

A sample was manufactured under the same conditions as in Example 1 except that no nitriding was carried out and that the polishing process was not carried out.

Comparative Example 6

A sample was manufactured under the same conditions as in Example 1 except that no nitriding was carried out and that, in the polishing process, the sample was only immersed in the slurry and the polishing time was set to 0 seconds.

Leakage Current Measurement

Then, the leakage current of the samples was measured.

Specifically, first, in each sample, as shown in FIG. 13, the pattern 61a was connected to earth 67 so as to be grounded while the pattern 61b was connected to a power supply 63. A leakage current measuring apparatus 65 was connected between the power supply 63 and the pattern 61b.

Then, a voltage was applied using the power supply 63 so that the electric field intensity was in a range of 0 to 2.0 MV/cm, thereby measuring a leakage current.

Figure 14:
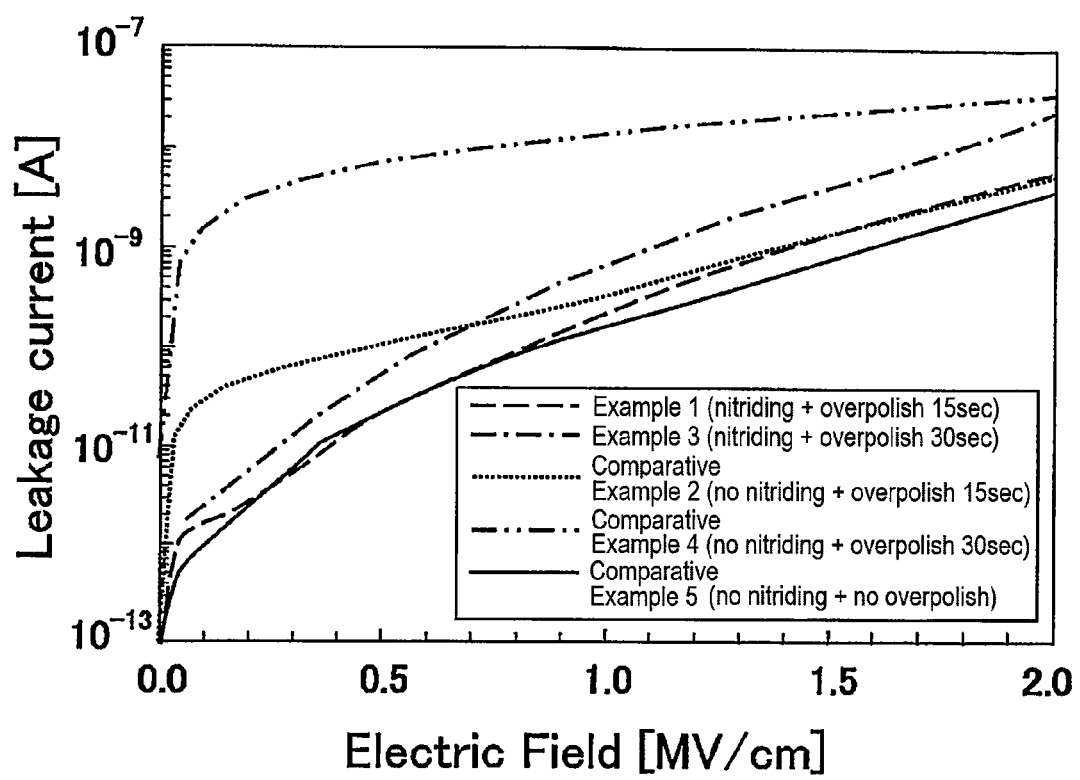
FIG. 14 is a diagram showing the relationships between the electric field and the leakage current in Examples and Comparative Examples.

FIG. 14 shows the results of Examples 1 and 3 and Comparative Examples 2, 4, and 5.

As is clear from FIG. 14, in Examples 1 and 3 (with nitriding), the leakage current was approximately the same as that of the sample which was not polished (Comparative Example 5), while, in Comparative Examples 2 and 4 (with no nitriding), the leakage current increased as the overpolish time increased.

Leakage Current Degradation and Dielectric Constant Degradation

Then, with respect to the samples of Examples 1 to 3 and Comparative Examples 1 to 4, the leakage current degradation and the dielectric constant degradation were measured.

Figure 15:
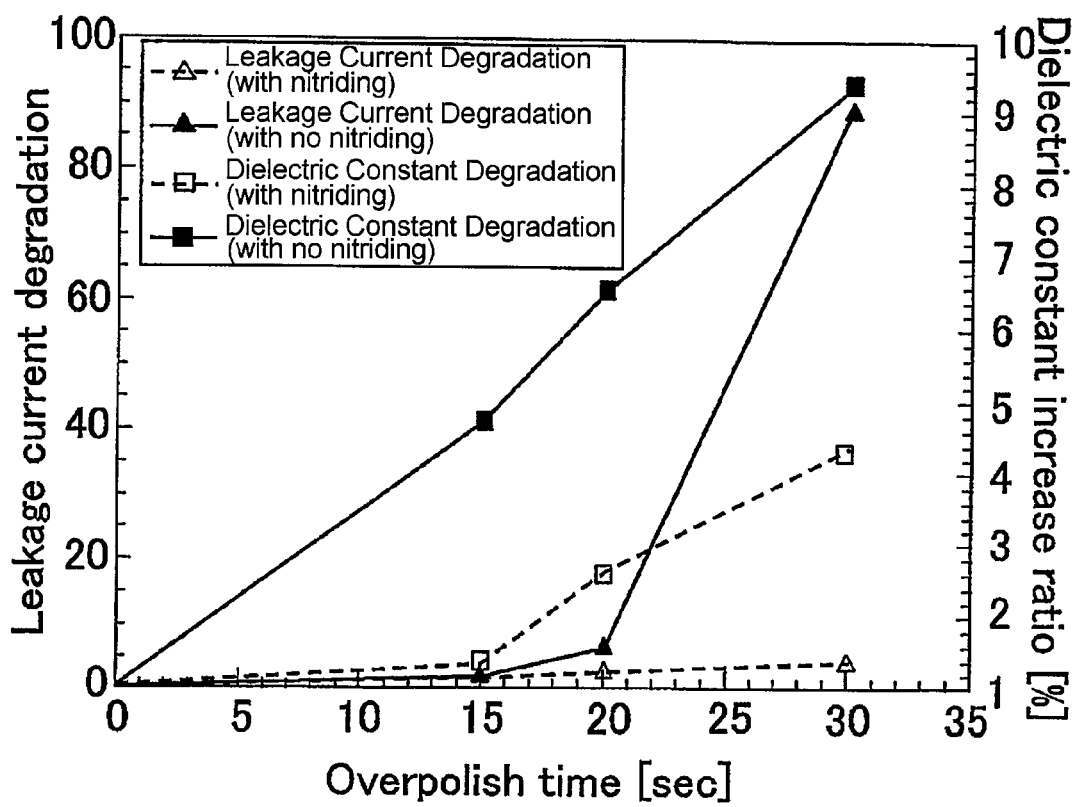
FIG. 15 is a diagram showing the relationships of the leakage current degradation and the dielectric constant degradation with the overpolish time in Examples and Comparative Examples.

The leakage current degradation and the dielectric constant degradation were defined by the following formulas.

leakage current degradation=$I/I_{ini}$ where
I: leakage current after overpolish
$I_{ini}$: leakage current at overpolish time of 0 seconds dielectric constant degradation=$(k-k_{ini})/k_{ini}$ where
k: dielectric constant after overpolish
$k_{ini}$: dielectric constant at overpolish time of 0 seconds
The results are shown in FIG. 15.

As is clear from FIG. 15, the leakage current degradation and the dielectric constant degradation were smaller in Examples 1 to 3 than in Comparative Examples 2 to 4 and these differences appeared more significantly as the overpolish time increased.

Binding State Evaluation of Interlayer Insulating Films

Then, the binding state of atoms/molecules forming the $CF_x$ film 5 of each sample was evaluated according to the following sequence.

First, C1s photoelectron spectra of the samples were obtained.

Specifically, C1s photoelectron spectra of the samples of Examples 1 and 3 and Comparative Examples 1, 2, 4, 5, and 6 were obtained using an XPS (X-ray Photoelectron Spectroscopy) apparatus.

Figure 16:
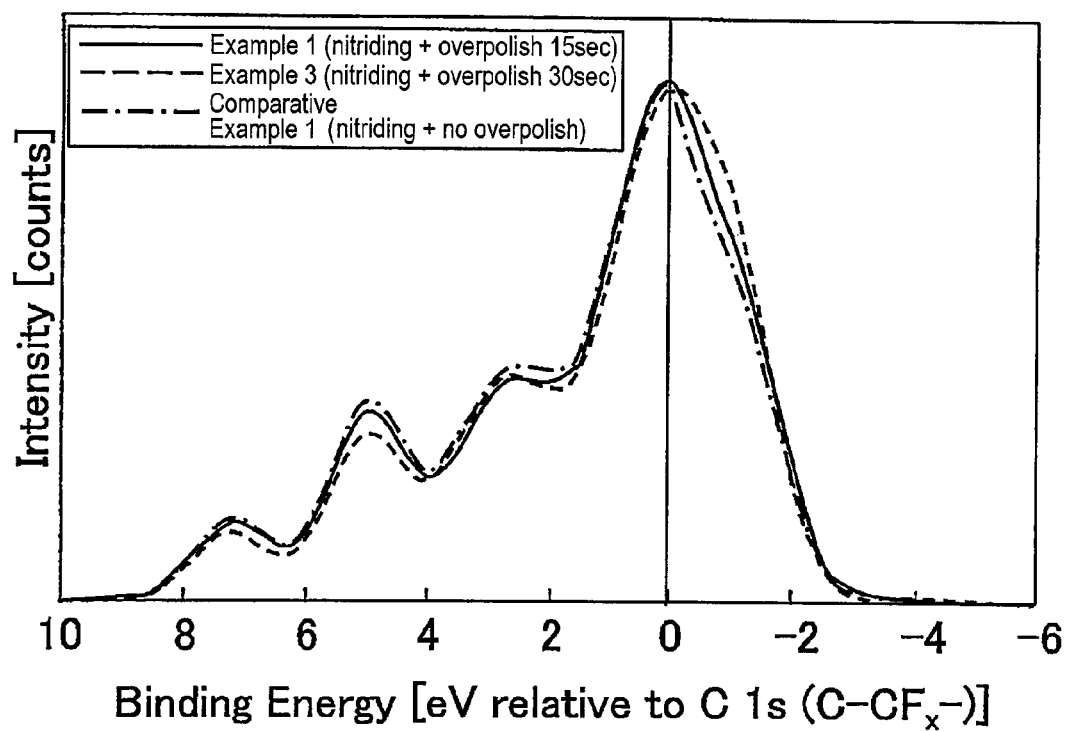
FIG. 16 is a graph showing C1s photoelectron spectra of Examples and a Comparative Example.
Figure 17:
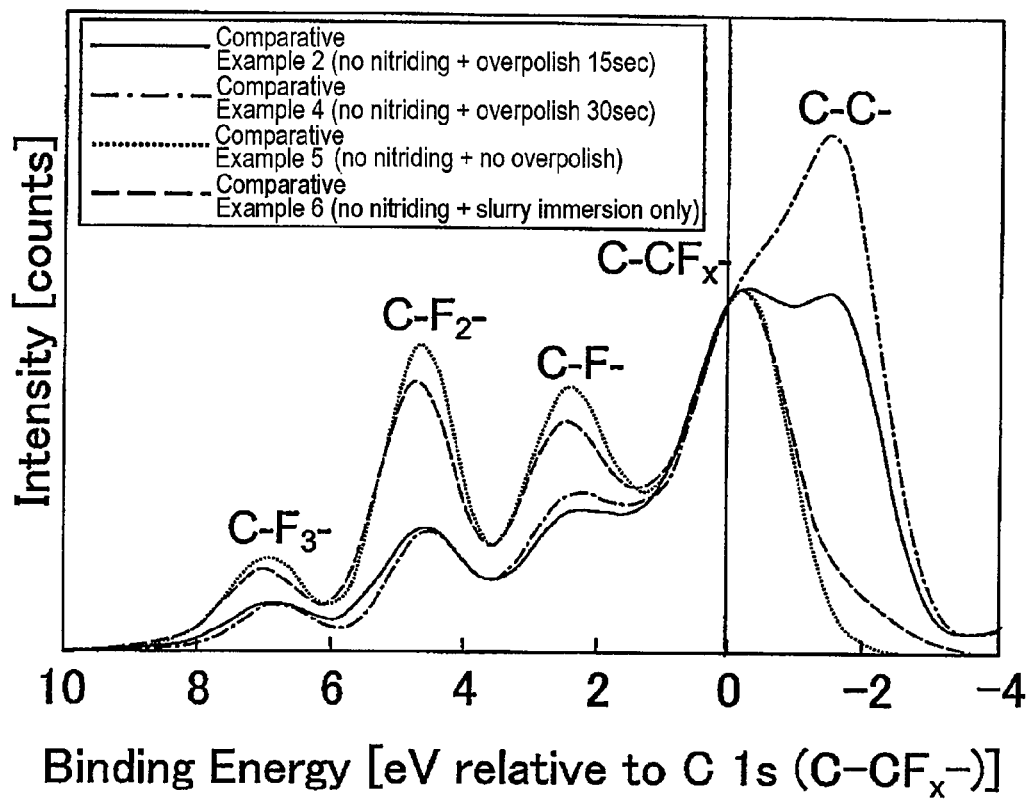
FIG. 17 is a graph showing C1s photoelectron spectra of Comparative Examples.

FIG. 16 shows the results of Examples 1 and 3 and Comparative Example 1 (i.e. the results of the samples which were nitrided) while FIG. 17 shows the results of Comparative Examples 2, 4, 5, and 6 (i.e. the results of the samples which were not nitrided).

As shown in FIG. 16, in the case where the sample was nitrided, no change was observed in binding-strength peak position and intensity regardless of the presence or absence of overpolish and the overpolish time. This means that the CF structure of the $CF_x$ film 5 was not changed due to the overpolish.

On the other hand, as shown in FIG. 17, in the case where the sample was not nitrided, as the overpolish time increased, the C-$F_x$ peak intensity decreased while the C-C peak intensity increased.

Then, F1s photoelectron spectra of Comparative Examples 2, 4, 5, and 6 were obtained using the same XPS apparatus.

Figure 18:
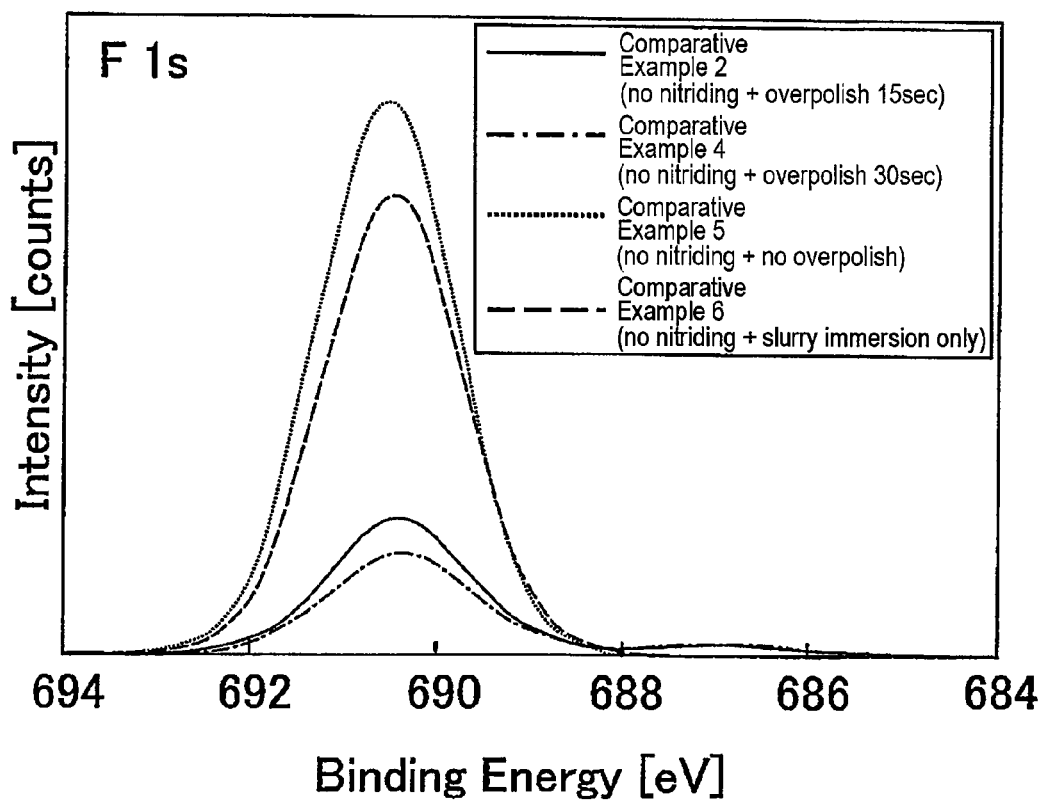
FIG. 18 is a graph showing F1s photoelectron spectra of Comparative Examples.

The results are shown in FIG. 18.

From FIG. 18, the F peak intensity decreased as the overpolish time increased.

From the XPS measurement results described above, it is considered that, in the Comparative Examples (samples not nitrided), C—$F_x$ bonds of the $CF_x$ film 5 were decomposed due to the overpolish while C—C bonds increased in number. This may suggest that the dielectric constant degradation due to the overpolish was caused by the increase in the number of C—C bonds.

CONCLUSION

From the evaluation described above, it is seen that, by nitriding the $CF_x$ film 5, it is possible to prevent a change in the binding state (change in the composition) of the $CF_x$ film 5 due to polishing and thus to prevent an increase in leakage current and dielectric constant.

INDUSTRIAL APPLICABILITY

A semiconductor device of this invention is applicable to a semiconductor device comprising a multilayer wiring structure.

DESCRIPTION OF SYMBOLS 1 semiconductor device
1a semiconductor device
1b semiconductor device
1c semiconductor device
3 substrate
4a lower-side circuit layer
4b upper-side circuit layer
5 $CF_x$ film
5a first $CF_x$ film
5b second $CF_x$ film
7 wiring layer
7a first wiring layer
7b second wiring layer
8a main wiring layer
8b barrier layer
9 nitride layer
9a first nitride layer 9b second nitride layer
10 outer wall
11 recess
12 antenna
13 gas introducing pipe
14 wafer
21 radial line slot antenna (RLSA)
22 lower shower plate
23 upper shower plate
24 process chamber
25 RF power supply
26 gas introducing pipe
31 stage
41 plate
43 pad
45 shaft
47 carrier
49 workpiece to be polished
51 shaft
53 supply pipe
55 slurry
59 pattern
61a pattern
61b pattern
63 power supply
65 leakage current measuring apparatus
67 earth
102 plasma processing apparatus
201 CMP apparatus

The invention claimed is:

1. A method of manufacturing a semiconductor device, comprising:
    (a) forming an interlayer insulating film comprising a $CF_x$ film with no cap film thereon;
    (b) forming a recess of a predetermined pattern on the $CF_x$ film;
    (c) providing a wiring layer directly on the $CF_x$ film so as to bury the recess and to cover the $CF_x$ film; and
    (d) removing the excess wiring layer on the $CF_x$ film other than in the recess by CMP (Chemical Mechanical Polishing), thereby exposing a surface of the $CF_x$ film,
    wherein (e) nitriding the surface of the $CF_x$ film is provided before or after (b).

2. The method of manufacturing a semiconductor device according to claim 1, wherein (a) comprises forming the $CF_x$ film by CVD using a plasma which is generated using a noble gas.

3. The method of manufacturing a semiconductor device according to claim 1, wherein (e) comprises nitriding the surface of the $CF_x$ film to 1 to 5 nm.

4. A semiconductor device being manufactured by the method of manufacturing a semiconductor device according to claim 1.

* * * * *